United States Patent [19]

Greco et al.

[11] Patent Number: 4,975,141

[45] Date of Patent: Dec. 4, 1990

[54] LASER ABLATION FOR PLASMA ETCHING ENDPOINT DETECTION

[75] Inventors: Nancy A. Greco, Lagrangeville; Joseph P. Nogay, Newburgh, both of N.Y.

[73] Assignee: International Business Machines Corporation, Armonk, N.Y.

[21] Appl. No.: 501,572

[22] Filed: Mar. 30, 1990

[51] Int. Cl.$^5$ .................... H01L 21/306; B44C 1/22; C23F 1/02; B29C 37/00
[52] U.S. Cl. ..................... 156/626; 156/643; 156/656; 156/659.1; 156/662; 156/345; 204/192.33; 219/121.69
[58] Field of Search ............... 156/626, 627, 643, 646, 156/652, 653, 656, 657, 659.1, 662, 345; 204/192.32, 192.33; 427/53.1; 219/121.68, 121.69, 121.83, 121.76, 121.77

[56] References Cited

U.S. PATENT DOCUMENTS

| | | | |
|---|---|---|---|
| 4,198,261 | 4/1980 | Busta et al. | 156/626 |
| 4,479,848 | 10/1984 | Otsubo et al. | 156/626 |
| 4,496,425 | 1/1985 | Kuyel | 156/626 |
| 4,611,919 | 9/1986 | Brooks et al. | 356/357 |
| 4,687,539 | 8/1987 | Burns et al. | 156/626 |
| 4,717,446 | 1/1988 | Nagy et al. | 156/626 |

Primary Examiner—William A. Powell
Attorney, Agent, or Firm—Jeffrey L. Brandt

[57] ABSTRACT

A method for detecting the endpoint in an etching process including the steps of: providing a structure to be etched including at least a first layer of material overlying a second layer of material; ablating an aperture in the first layer using a beam of coherent electromagnetic radiation so as to expose a portion of the second layer; exposing the structure to an etchant for etching the second layer; and monitoring the second layer using the ablated aperture so as to detect an endpoint for the etching process.

19 Claims, 1 Drawing Sheet

LASER ABLATION FOR PLASMA ETCHING ENDPOINT DETECTION

The present invention relates generally to detecting an endpoint when etching through a multiple layer structure, and more particularly to the use of laser ablation to form an endpoint detection site.

BACKGROUND OF THE INVENTION

Plasma etching and related processes such as reactive ion etching (RIE) are used in semiconductor device processing to transfer specific patterns into underlying films. Typically, such patterns are defined in an overlying layer of photoresist and, through the use of an etching process, transferred into an underlying film. Such an underlying film can comprise, for example, one of the insulating or conducting films typically utilized over semiconductor materials in the formation of semiconductor devices.

As part of the process of transferring a pattern into an underlying film, it is necessary to stop the etching process at a specific depth. This depth is typically, but not always, equal to the total depth of the underlying film. The point at which the specific depth has been reached is called in the art the endpoint of the etching process. The accuracy with which this depth is obtained and the completeness with which the film is removed have a direct impact on the performance of the subsequently completed device. If, for example, an undesired residue of film is left in a transistor, it can result in an undesirably high resistance value for a particular transistor region. To further complicate the process of transferring a pattern, device topology as well as previous processing steps can cause the thickness of the film being etched to vary substantially across the object being etched.

Several methods are currently known for detecting an endpoint during etching.

The process of Optical Emission Spectroscopy (OES) operates by detecting the wavelength of light emitted by a specific chemical species, usually a species of a by-product of the etching process. Using a monochromator, this specific wavelength is isolated by filtering out all other wavelengths. The energy in this isolated, filtered light is converted into a specified unit of energy, for example into volts through the use of a detector. The detector is used to monitor the magnitude of the energy through, for example, a strip-chart reader or a computer monitor. A predetermined change in the light energy is used to detect the endpoint.

OES is advantageous in that no endpoint site is required. It also, however, entails several disadvantages, including: (1) the understanding of complex plasma chemistry whereby to select a chemical species for monitoring; (2) a high dependence on pattern density (etched area to unetched area), whereby a low pattern density (e.g. 20% or less) produces very little of the chemical species being monitored, making detection of the endpoint difficult; (3) a limited selection of gases for etching so as to avoid generating a chemical species similar to the endpoint species; and (4) confusing chemical species generated from the inside of the etching chamber.

U.S. Pat. No. 4,611,919 to Brooks, Jr. et al. shows a process for detecting an endpoint by monitoring a change in a voltage proportional to the total intensity of energy reflected from a wafer during an etching process. This method is disadvantageous in requiring a very high etch rate ratio of the overlying film to the underlying film (i.e. high selectivity). This method is also sensitive to pattern density in the manner described above with respect to OES.

U.S. Pat. No. 4,198,261 to Busta et al. shows a method utilizing interferometry for endpoint detection. This method monitors the interference fringes produced as a result of multiple reflections due to the different refractive indices of two films. Each interference fringe corresponds to a known thickness of the film that has been etched. This method has the advantage of being insensitive to pattern density or to the etching gasses used.

The method of Busta et al., however, as typically used in the art, has the disadvantage of requiring an endpoint detection area, termed a fiducial site (or area, region, or mark), to detect an endpoint. Such a fiducial site comprises at least one dedicated die area for detecting an endpoint. Such a fiducial site requires an overlying film which must be removed prior to the etching of an underlying film. Where, for example, the overlying film is photoresist, it is removed by exposure and subsequent development. The use of a fiducial site suffers from the well-known disadvantages of requiring extra masking steps, alignment steps, and exposure steps in addition to the device fabrication process steps.

U.S. Pat. No. 4,687,539 to Burns et al. shows a process wherein an excimer laser is used to burn/etch through a film, and the endpoint is detected by analyzing the wavelength of the flouresced, vaporized by-product. This endpoint detection is similar to the OES process described hereinabove. Burns et al. has the many known disadvantages inherent in the use of a laser for etching, including substantial material and process limitations.

Briefly: U.S. Pat. No. 4,479,848 to Otsubo et al. shows an etching process wherein a change in contrast of a dicing stripe pattern is used to determine an endpoint; U.S. Pat. No. 4,496,425 to Kuyel shows a process wherein the intensity of light reflected from a Fresnel zone plate is used to determine an endpoint; and U.S. Pat. No. 4,717,446 to Nagy et al. shows a method wherein a separate monitor wafer is used to measure the etch rate and determine an endpoint.

OBJECTS OF THE INVENTION

It is an object of the present invention to provide a new and improved method and apparatus for endpoint detection that does not require the use of a large, preformed fiducial or endpoint detection site.

Another object of the present invention is to provide such a method and apparatus which permits the selection of an endpoint detection site anywhere within the area being etched.

A further object of the present invention is to provide such a method and apparatus which can provide an extremely small area, i.e. the diameter of a laser beam, for detecting an endpoint.

SUMMARY OF THE INVENTION

In accordance with one aspect of the present invention, there is provided a new and improved method of detecting an etching endpoint comprising the steps of: providing a structure to be etched including at least a first layer of material overlying a second layer of material; ablating an aperture in the first layer using a beam of electromagnetic radiation so as to expose a portion of the second layer; exposing the structure to an etchant for etching the second layer; and monitoring the second layer using the aperture so as to detect an endpoint for the etching process.

In accordance with another aspect of the present invention, there is provided a new and improved apparatus for detecting an endpoint while etching a structure including at least a first layer of material overlying a second layer of material, the apparatus comprising: means including a beam of electromagnetic radiation for ablating an aperture in the first layer so as to expose a portion of the second layer; means for etching the second layer; and means using the aperture for monitoring the second layer so as to detect an endpoint for the etching means.

BRIEF DESCRIPTION OF THE DRAWINGS

These and other objects, features, and advantages of the present invention will become apparent from a consideration of the following detailed description of the invention in conjunction with the drawing Figures, in which.

DETAILED DESCRIPTION OF THE INVENTION

Figure 1:
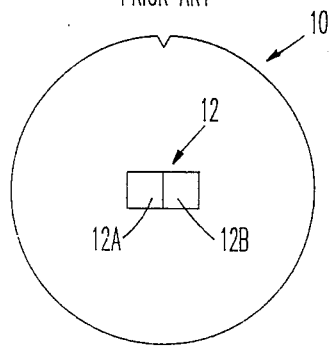
FIG. 1 is a plan view of a semiconductor wafer including a fiducial endpoint detection site in accordance with the prior art.

Referring now to FIG. 1, a semiconductor wafer 10 occupying the area of two die 12A and 12B. Wafer 10 comprises, for example, a conventional five inch diameter, silicon-based wafer described in further detail below. Each die 12A, 12B occupies the space of one chip site, with approximately 100 such chip sites being available on a five inch wafer. Fiducial area 12 is formed in the center of wafer 10 and, during an etching process described below, is aligned with a monitoring laser (not shown) and used to detect an endpoint for an etching process.

Figure 1A:
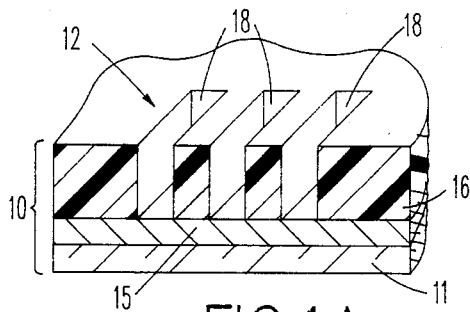
FIG. 1A is a perspective view of an enlarged portion of FIG. 1 showing details of the wafer and fiducial site of FIG. 1.

Referring now to FIG. 1A, wafer 10 comprises a multi-layer structure formed, for example, on a five inch diameter silicon substrate 11. Substrate 11 is fabricated using a conventional crystal pull, and supports the subsequent formation of semiconductor chips including devices (not shown) such as transistors, resistors, and capacitors. An intermediate layer 15, comprising, for example, an insulator such as an oxide or a nitride, a conductor such as a metal or a semiconductor, or a stack of such materials, is formed over the surface of substrate 11. A layer 16 of photoresist is formed conformally over layer 15.

Continuing to describe FIG. 1A, details of fiducial area 12 are shown which are not visible in FIG. 1. More specifically, fiducial area 12 comprises a patterned region of photoresist layer 16 including apertures 18 etched in the photoresist layer so as to expose the upper surface of layer 15.

In operation, fiducial area 12 is monitored with a laser during the etching of layer 15 so as to detect an endpoint for the etching process. More specifically, during this etching process, the area of layer 15 exposed through apertures 18 is etched away. Fiducial area 12 is monitored, typically by reflected light interferometry or optical emission spectroscopy as described above, to determine a desired endpoint. Such an endpoint can be at the bottom of layer 15, or at an intermediate layer or position within layer 15.

This use of fiducial areas such as fiducial area 12 is subject to many disadvantages. One major, apparent disadvantage is the extra processing steps necessary to pattern photoresist layer 16 so as to open apertures 18. Such steps include, at a minimum, the (1) masking, (2) exposure, and (3) development of photoresist layer 16 to form apertures 18. Other disadvantages include difficulty in aligning fiducial area 12 with a monitoring laser, and the use of two chip sites to form the fiducial area.

Figure 2:
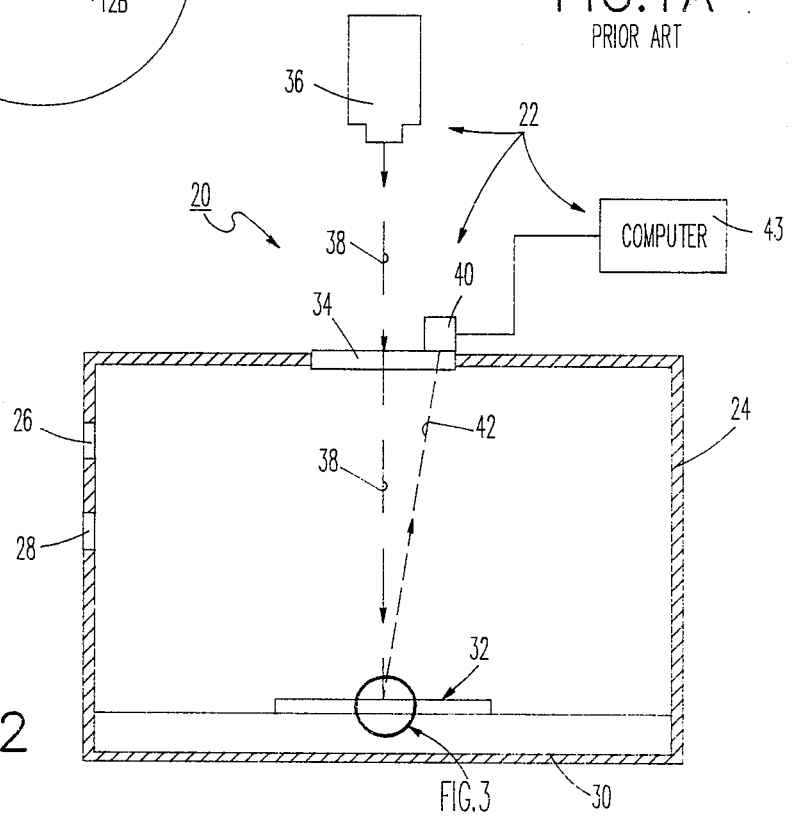
FIG. 2 is a schematic view of an endpoint detection system constructed in accordance with the present invention.

Referring now to FIG. 2, an etching system 20 is shown including an endpoint monitoring system 22 constructed in accordance with the present invention. Etching system 20 includes a conventional plasma etching chamber 24 with apertures 26 and 28 serving as inlets and outlets for etching gases and etching by-products. Chamber 24 includes a platform 30 for supporting a wafer 32 to be etched within the chamber, and an optically transparent window 34 positioned in a wall of chamber 24 generally opposite and parallel to the major surface of wafer 32.

Figure 3:
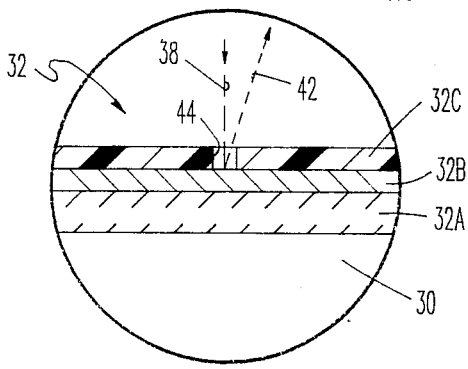
FIG. 3 is an enlarged view showing the structure of wafer 32 of FIG. 2.

Endpoint monitoring system 22 includes a laser 36 positioned to direct a beam 38 of light energy through window 34 and generally perpendicular against wafer 32. As used herein, the term "light energy" includes the entire spectrum of coherent electromagnetic radiation as can be utilized in accordance with the present invention in the manner described below. As shown in detail in FIG. 3, wafer 32 comprises a substrate 32A of semiconductor or ceramic material, overlain by an intermediate layer 32B of an insulating material, conductive material, or a stack of such materials. A coating layer 32C of photoresist overlies layer 32B.

A detector 40 is positioned proximate window 34 to collect and measure the intensity of a light energy beam 42 reflected back from wafer 32. Detector 40 is electronically connected to a monitoring device 43 such as a computer system including a video display or a strip chart recorder.

In one embodiment of the present invention, laser 36 comprises a pulsed Ar-Fl excimer laser having a wavelength of about 193 nanometers. Detector 40 comprises a conventional detector for measuring the intensity of reflected beam 42, and monitor 43 comprises a conventional control computer with a graphical display, for example an IBM model 3270 computer.

In operation, excimer laser 36 is adjusted to provide beam 38 of a sufficient energy to ablate an aperture in photoresist layer 32C. As used herein, the term "ablate" means the removal of the overlying layer (i.e. layer 32C) with little or no damage to the underlying layer (i.e. layer 32B). The present inventors have determined that, for example, utilizing an excimer laser 36 of the type described above, at a power of about 2.0 watts, a pulse frequency of about 1 pulse/microsecond, and for a duration of about 1 second, a conventional photoresist material 32C of about 1 micron thickness is cleanly ablated so as to expose an undamaged surface portion of layer 32B. Such an ablated aperture is indicated at 44 in FIG. 3.

Laser 36 is then adjusted so as to reduce the intensity of beam 38 to have a power in the range of 25 millimicro watts. Depending on the composition of layer 32B, the wavelength of laser 36 can also be adjusted with the object of providing a wavelength which is reflected off of (versus absorbed by) layer 32B. Laser 36 with lower power beam 38 is then used to monitor the etching process so as to detect an etching endpoint within aperture 44. Because layers 32B and 32C comprise materials having different indices of refraction, reflected beam 42 generates interference fringes. This monitoring is preferably done by measuring the reflected laser beam intensity using detector 40.

In a conventional manner, the interference fringes detected by detector 40 are counted and/or determined to expire by computer 43. Computer 43 can then cue an operator to terminate the etching process or, by a connection to the control apparatus (not shown) for etching chamber 24, the computer can terminate both the etching process and the operation of the laser automatically.

It will be understood that the example described above can be straight-forwardly extended to the ablation of overlying materials of differing thicknesses and materials using different types of lasers. For example and without limitation, the present inventors have further determined that an Ar-Fl excimer laser having a 248 nanometer wavelength can be used to cleanly ablate 10 microns of polyimide material over silicon with a 2 second exposure at a pulsed 68 watts Many such combinations of ablating lasers and overlying materials will become readily apparent to those skilled in the art.

In the embodiment of the invention described above, the endpoint detection means is operable through a single ablated aperture in the overlayer; i.e. the interference fringes in reflected beam 42 are measurable through single aperture 44. However, the invention is not so limited. The present invention can, for example, be used to ablate many such small apertures in overlayer 32C, permitting the use of a pattern-density sensitive monitoring process such as OES (described hereinabove). The benefits of the present invention are still realized in that there is no requirement for large, preformed, pre-placed fiducial marks of the type described above.

In another embodiment of the present invention, laser 36 can comprise two separate lasers, a high power laser to ablate the photoresist layer, and a low power laser to monitor the etching process. In yet another embodiment of the invention, the ablating step can be performed before wafer 32 is positioned in chamber 24. This will require an alignment with a monitoring laser 36. However, the use of the ablating step in accordance with the present invention will provide the advantage of avoiding the complex processing steps necessary to form the prior art fiducial area.

The present invention affords significant advantages over the prior art. Because the monitoring aperture 44 is formed by ablation, the complex and costly processing steps previously required to form a fiducial site are negated. The monitoring laser beam can be self-aligned with the ablated aperture, therefor requiring no complex alignment steps. The monitoring site need only comprise an area equal to that of the ablating laser beam—not the multiple chip sites required by prior art fiducial sites. Further, the monitoring site can be selected to be anywhere on the wafer being etched, including an actual chip site. When an actual chip site is selected for monitoring, versus a separate fiducial site, the monitoring process is significantly more accurate.

While several specific embodiments have been shown and described, the present invention can be beneficially utilized in any application wherein a patterned overlayer is used as a mask to etch an underlayer. The ablation of the overlayer can be performed by any source of coherent electromagnetic radiation sufficient to remove the overlayer without damaging the underlayer. The monitoring of the underlayer during the etching process can be performed by any means operable with the ablated endpoint detection site.

There is thus provided a new and improved method and apparatus for detecting the endpoint in an etching process. The invention utilizes a laser to ablate a monitoring aperture, and provides significant advantages over the prior art. The invention has particular utility in the field of semiconductor device manufacturing and processing.

While the present invention has been shown and described with respect to particular embodiments, it is not so limited. Numerous modification, changes, and improvements within the spirit and scope of the invention will occur to those skilled in the art.

What is claimed is:

1. A method comprising the steps of:
   providing a structure to be etched including at least a first layer of material overlying a second layer of material;
   ablating an aperture in said first layer using a beam of coherent electromagnetic radiation so as to expose a portion of said second layer;
   exposing said structure to an etchant for etching said second layer; and
   monitoring said second layer using said aperture so as to detect an endpoint for said etching process.

2. The method of claim 1 wherein said monitoring step includes the step of directing a second beam of electromagnetic radiation through said aperture.

3. The method of claim 2 wherein said ablating and monitoring step are performed using a single laser.

4. The method of claim 3 wherein said ablating and monitoring steps are performed using an excimer laser.

5. The method of claim 2 wherein said monitoring step includes monitoring the interference fringes contained in a reflection of said second beam.

6. The method of claim 1 wherein said ablating step is performed with said structure disposed in an etching chamber before an etchant is introduced into said etching chamber.

7. The method of claim 6 wherein said etchant comprises a chemical etchant.

8. The method of claim 7 wherein said etchant comprises a plasma etchant.

9. The method of claim 1 wherein:
   said first layer comprises a photoresist; and
   said second layer comprises an insulator or a conductor.

10. Apparatus for detecting an endpoint while etching a structure including at least a first layer of material overlying a second layer of material, said apparatus comprising:
    means including a beam of coherent electromagnetic radiation for ablating an aperture in said first layer so as to expose a portion of said second layer;
    means for etching said second layer; and means using said aperture for monitoring said second layer so as to detect an endpoint for said etching means.

11. The apparatus of claim 10 wherein said monitoring means includes means for directing a second beam of coherent electromagnetic radiation through said aperture.

12. The apparatus of claim 11 wherein said ablating and monitoring means share a common laser.

13. The apparatus of claim 12 wherein said ablating and monitoring means each include an excimer laser.

14. The apparatus of claim 11 wherein said monitoring means includes means for monitoring the interference fringes contained in a reflection of said second light beam.

15. The apparatus of claim 11 wherein said monitoring means includes:

a detector for converting a reflection of said second beam to an electrical signal; and
means for monitoring a selected property of said electrical signal to detect said endpoint.

16. The apparatus of claim 11 and further including:
an etching chamber surrounding said structure; and
a window disposed in said chamber transparent to said beam of coherent electromagnetic radiation;
such that said ablating and monitoring means are operable through said window.

17. The method of claim 16 wherein said etchant comprises a chemical etchant.

18. The method of claim 17 wherein said etchant comprises a plasma etchant.

19. The apparatus of claim 10 wherein:
said first layer comprises a photoresist; and
said second layer comprises an insulator or a conductor.

* * * * *